US008686884B2

(12) United States Patent
Baumgartner et al.

(10) Patent No.: US 8,686,884 B2
(45) Date of Patent: Apr. 1, 2014

(54) TESTING OF DIGITAL TO ANALOG CONVERTERS IN SERIAL INTERFACES (75) Inventors: Steven J. Baumgartner, Zumbro Falls, MN (US); William D. Corti, New Windsor, NY (US); Joseph Natonio, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/586,176

(22) Filed: Aug. 15, 2012

(65) Prior Publication Data
US 2014/0049415 A1 Feb. 20, 2014

(51) Int. Cl.
*H03M 1/10* (2006.01)
(52) U.S. Cl.
USPC .............................. 341/120; 341/144; 341/145
(58) Field of Classification Search
USPC .................................. 341/120, 144, 145, 163
See application file for complete search history.

(56) References Cited

U.S. PATENT DOCUMENTS

| 5,818,370 | A | 10/1998 | Sooch et al. | |
|---|---|---|---|---|
| 6,131,074 | A * | 10/2000 | Kawai | 702/107 |
| 6,177,815 | B1 | 1/2001 | Baumgartner et al. | |
| 6,667,703 | B1 * | 12/2003 | Reuveni et al. | 341/120 |
| 7,126,510 | B2 | 10/2006 | Alon et al. | |
| 7,129,867 | B2 | 10/2006 | Kim et al. | |
| 7,158,070 | B1 * | 1/2007 | Yang et al. | 341/163 |
| 7,365,662 | B2 | 4/2008 | Marsili et al. | |
| 7,522,077 | B1 * | 4/2009 | Itkin | 341/120 |
| 7,573,967 | B2 | 8/2009 | Fiedler | |
| 7,755,522 | B1 | 7/2010 | Song et al. | |
| 7,791,519 | B2 * | 9/2010 | Matsukawa et al. | 341/144 |
| 7,880,650 | B2 * | 2/2011 | Feddeler et al. | 341/120 |
| 7,952,501 | B2 | 5/2011 | Kim et al. | |
| 7,994,954 | B2 | 8/2011 | Boomer et al. | |
| 8,154,275 | B2 | 4/2012 | Jain et al. | |
| 2006/0195749 | A1 * | 8/2006 | Cohen et al. | 714/742 |

OTHER PUBLICATIONS

Chapman, DB. & Miller, SJ., "Control System for Self Calibrating Digital Converter Offsets in a Analog System", original publication TDB v39 n6 Jun. 1996 p. 71-74, Jun. 1, 1996, electronic publication IP.Com Mar. 31, 2005. http://www.ip.com/pubview/IPCOM000117796D.
Ellersick, "Data Converters for High Speed CMOS Links", PhD Dissertation, Computer Systems Laboratory, Departments of Electrical Engineering & Computer Science, Stanford University, Aug. 2001, pp. 1-94.
IBM, U.S. Appl. No. 12/913,064, filed Oct. 27, 2010, "Coordinating Communications Interface Activities in Data Communicating Devices Using Redundant Lines", Ferraiolo et al.

* cited by examiner

*Primary Examiner* — Jean B Jeanglaude
(74) *Attorney, Agent, or Firm* — Chad J. Hammerlind; Robert R. Williams (57) ABSTRACT A system and method for testing digital to analog converters (DAC) in a serial interface having a comparator to receive an input signal and a local offset signal is disclosed. A first DAC selectably provides one of a global offset to the input signal during a normal mode of operation and a first test signal to the comparator during a test mode of operation. A second DAC selectably provides one of the local offset signals to the comparator during the normal mode of operation and a second test signal to the comparator during the test mode of operation. A test module may cause the first DAC to determine a first test signal to provide to the local offset input of the comparator and may cause the second DAC to incrementally change a test signal provided to the comparator.

12 Claims, 7 Drawing Sheets

TESTING OF DIGITAL TO ANALOG CONVERTERS IN SERIAL INTERFACES

FIELD

This invention generally relates to data transfer and more specifically to testing the functionality of digital to analog converters in serial interfaces.

BACKGROUND

High speed serial links have many advantages in electronic systems but problems arise with these advantages. Some of the benefits high speed serial links provide to electronic systems may be decreasing their size, lowering cost, and enhancing performance by limiting the number of wires needed. High serial link speeds also may be beneficial. Serial link speed may be increased by encoding more bits or by running the serial link at a faster symbol rate. Running serial links at a faster symbol rate is the simplest approach for increasing speeds of serial links, however, this approach is complicated by the low pass filtering inherent to wires and semiconductors at high frequencies. Low pass filtering in wires along with noise, distortion, and loss may cause the digital signal to produce errors in its binary output by distorting the signal waveform. Over short distances and low bit rates, few errors are likely to occur, but the signal integrity of waveforms tends to decrease over longer distances and at higher bit rates.

There are solutions for correcting degraded signals in high speed serial links. To correct for degradations, serial link recovery systems or serial interfaces may include a line receiver followed by sampling circuits that convert an analog signal to a digital signal. In differential interfaces, the line receiver is differential and the sampling circuits are usually a DCVS (differential cascode voltage switch) sense latch or a CML (current mode logic) topology. To use these technologies for high speed serial interfaces, one or more DACs (digital to analog converters) may be coupled to these circuits to compensate for device mismatches and to cancel out threshold offsets in the data path.

SUMMARY

According to embodiments of the invention, a serial interface is provided having a comparator to receive an input signal and a local offset signal. Also, a first digital to analog converter (DAC) is present to selectably provide one of a global offset to the input signal during a normal mode of operation and a first test signal to the comparator during a test mode of operation. Also present is a second DAC to selectably provide one of the local offset signals to the comparator during the normal mode of operation and a second test signal to the comparator during the test mode of operation. Also present is a test module to test the second DAC. The test module is used to cause the first DAC to determine a first test signal to provide to the local offset input of the comparator. The test module may cause the second DAC to incrementally change a test signal provided to the comparator. Also the test module evaluates the output of the comparator in response to the changes in the test signal to determine whether a function of the second DAC operates properly.

According to other embodiments, a method is provided for testing the functionality of a digital to analog converter (DAC) in a serial interface. The method may include providing a first DAC with an output voltage, the first DAC to output a global offset during a normal mode in the serial interface. The method may further include providing a second DAC with an output voltage, the second DAC to output a local offset during the normal mode in the serial interface. The first DAC may be used during a test mode in the serial interface to test the functionality of the second DAC.

According to another embodiment, a design structure tangibly embodied in a machine readable medium used in a design process is provided. The design structure having a serial interface. The serial interface includes a comparator to receive an input signal and a local offset signal. The serial interface also includes a first digital to analog converter (DAC) to selectably provide one of a global offset to the input signal during a normal mode of operation and a first test signal to the comparator during a test mode of operation. Also included is a second DAC to selectably provide one provide one of the local offset signal to the comparator during the normal mode of operation and a second test signal to the comparator during the test mode of operation. Also provided is a test module to test the second DAC. The test module causes the first DAC to determine a first test signal to provide to the local offset input of the comparator. The test module causes the second DAC to incrementally change the second test signal provided to the comparator, and to evaluate the output of the comparator in response to the changes in the first and second test signals to determine whether a function of the second DAC operates properly.

BRIEF DESCRIPTION OF THE DRAWINGS

Embodiments will be better understood from the following detailed description with reference to the drawings, in which.

DETAILED DESCRIPTION

Embodiments herein provide for an apparatus and method for testing the functionality of DACs of serial interfaces. Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of this invention as claimed. The same numbers may be used in the Figures and the Detailed Description to refer to the same devices, parts, components, steps, operations, and the like.

Figure 1:
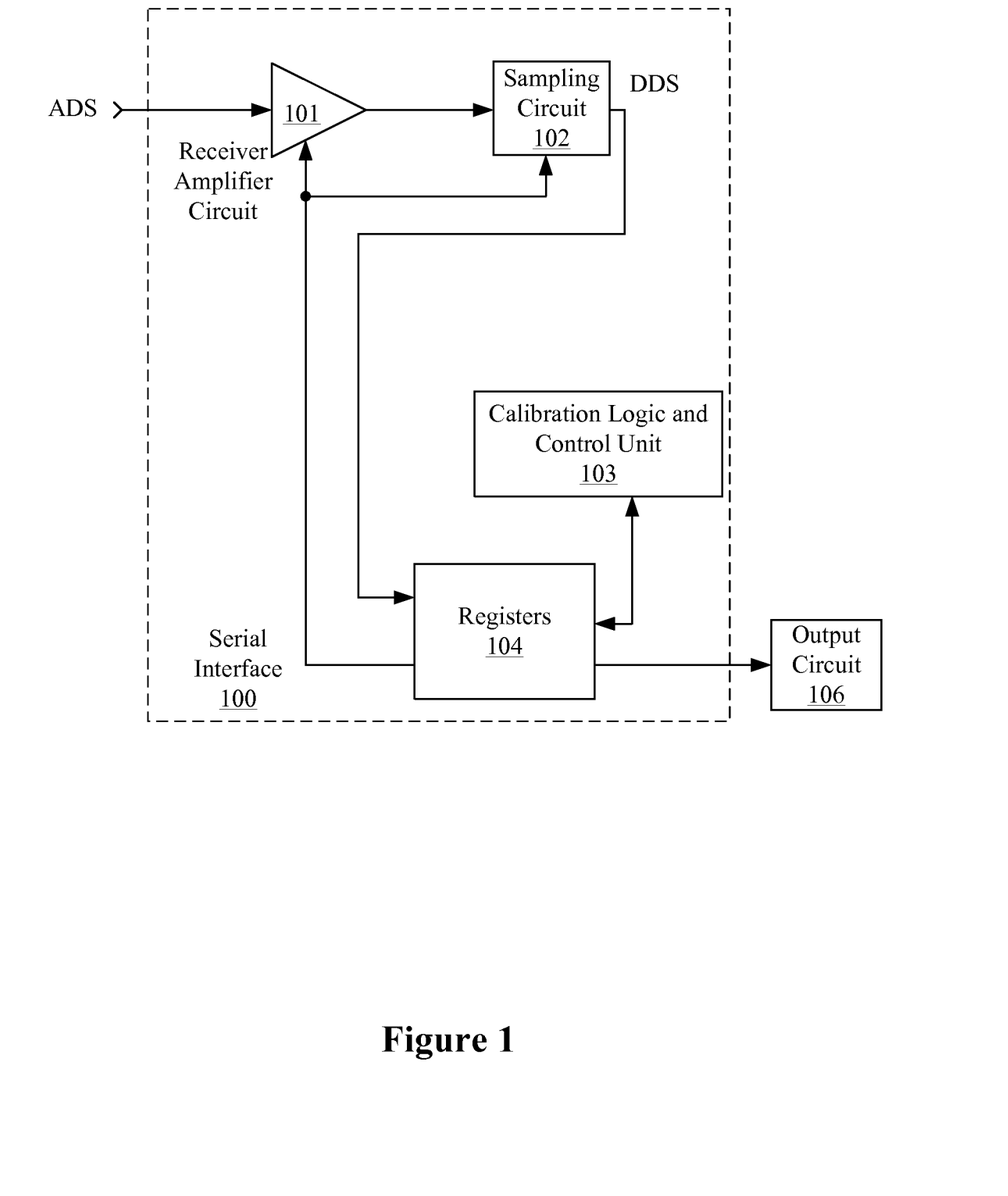
FIG. 1 is a high-level diagram of major components of a serial interface according to an embodiment.

FIG. 1 shows a high level block diagram of a serial interface 100 according to an embodiment. The serial interface 100 may contain a receiver amplifier circuit 101, a sampling circuit 102, a calibration logic and control unit 103, and registers 104. The serial interface 100 may receive an analog data signal ADS and output a digital data signal DDS to an output circuit 106. In one embodiment, ADS may be from a data bus, such as a high speed serial link, and enter the serial interface 100 through the receiver amplifier circuit 101. The receiver amplifier circuit 101 amplifies and may add a global offset to the incoming ADS. The ADS that is amplified and has a global offset added to it may be called the globally offset data signal. The globally offset data signal produced by the receiver amplifier circuit 101 may be provided to a sampling circuit 102. In an embodiment there may be one or more sampling circuits 102. The sampling circuit 102 compares the globally offset data signal with a local offset signal at respective phases of a clock domain local to the serial interface 100. The sampling circuit 102 outputs one bit of a DDS.

The sampling circuit 102 may provide the DDS to registers 104. In addition, the registers 104 may be used to store calibration coefficients used for the global and local offsets used in the serial interface 100. A calibration coefficient represents a signal offset for an analog data signal. The calibration coefficients may be digital codes that correspond with a particular analog signal level output from a DAC when the digital code is input to the DAC. From the digital code, the DAC produces an analog signal that is added to an analog input signal, thereby adjusting the input signal by the offset amount. For instance, if a data signal is supposed to be 5V, but the data signal is actually 3V, then an offset of 2V may be added to the 3V to produce the 5V level. The digital codes stored in the registers 104 may be determined by calibration processes in the calibration logic and control unit 103 that are described below. The calibration processes may be run during a calibration mode of the serial interface 100 or in other modes, such as a test mode.

Figure 2:
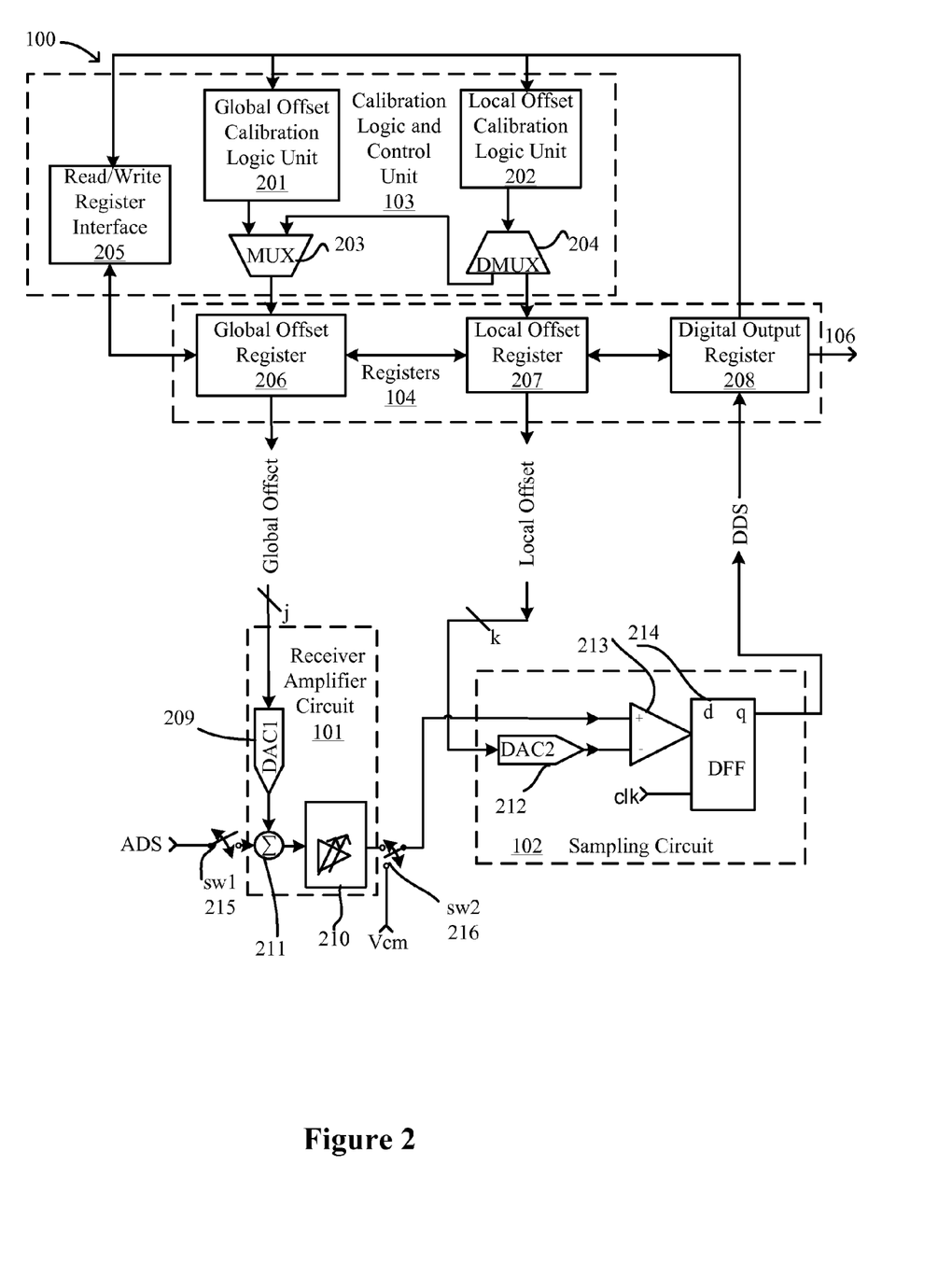
FIG. 2 is a diagram in greater detail of the major components of the serial interface of FIG. 1 with self testing capabilities according to an embodiment.

FIG. 2, in one aspect, is a diagram showing in greater detail the components of the serial interface 100 shown in FIG. 1. The calibration logic and control unit 103 may contain a global offset calibration logic unit 201, a local offset calibration logic unit 202, a multiplexer 203, a demultiplexer 204 and a read/write register interface 205. The register unit 104 may contain a global offset register 206, a local offset register 207, and a digital output register 208. The receiver amplifier circuit 101 may contain one or more first digital to analog converters (DAC1) 209, an amplifier 210, and an offset adder 211. Sampling circuit 102 may contain a second digital to analog converter (DAC2) 212, a comparator 213, and a sampling latch 214. As mentioned, the sampling circuit 102 converts an analog signal to a digital signal. According to various embodiments, various components of the serial interface 100 described above may have different functions depending on the mode of operation of the serial interface 100. The description of the functions of the components is discussed further below.

The serial interface 100 may have three possible modes of operation: normal mode, calibration mode, or test mode. In normal mode, the serial interface 100 receives the ADS and restores the ADS by adding a global offset. The serial interface 100 provides the restored signal, DDS, in digital form to the output circuit 106. In calibration mode, the serial interface 100 is calibrated for offsets in the data path, and mismatches and other signal distortion errors caused by components of the serial interface 100. Calibration mode calibrates the serial interface 100 by determining calibration coefficients or calibration digital codes. The calibration digital codes may be used by the serial interface 100 in normal mode for modifying the ADS for offsets in the data path, mismatches, and distortion errors. The calibration digital codes may be used to generate an offset analog signal to add to the ADS. In test mode, the serial interface 100 may determine whether particular components of the serial interface 100 are functioning properly. The test mode is described below.

Referring to FIG. 2, in normal mode ADS may enter into the receiver amplifier circuit 101 when a first switch (sw1) 215 is closed. The receiver amplifier circuit 101 may correct for offsets in ADS and data degradation over the serial link. ADS may be input to the offset adder 211, which may add a global offset to ADS. A global offset calibration digital code may be provided to the DAC1 209 from the global offset register 206. The DAC1 209 uses the digital code to generate a corresponding global offset analog signal. The globally offset data signal may then pass through the amplifier 210, which may be a differential amplifier as shown in FIG. 2, but may optionally be other types of amplifiers. The position of the offset adder 211 and the amplifier 210 may be interchangeable, i.e., ADS may pass through the amplifier 210, then through the offset adder 211 in one embodiment.

The global offset analog signal, that may be added to ADS, may compensate for one or more global signal integrity problems. Global offsets are generally offsets that affect all circuits in the serial interface 100 equally. The need for a global offset correction may come from discrepancies in driver sources, unbalanced channels, or a mismatch in the amplifier 210. A particular value of a global offset analog signal may be determined using the global offset calibration logic unit 201 when the serial interface 100 is in calibration mode. A global offset calibration digital code corresponding to a global offset analog signal may be stored in the global offset register 206 after calibration.

During normal mode, the amplified data signal produced by the receiver amplifier circuit 101 may be sent to the sampling circuit 102 when a second switch (sw2) 216 is moved to a first position, thereby coupling the receiver amplifier circuit 101 and the sampling circuit 102. The globally offset data signal is coupled with the noninverting (+) inputs of the comparator 213 of the sampling circuit 102. The inverting input (−) of the comparator 213 may be coupled with a local offset analog signal generated by the DAC2 212 from a local offset digital code. However, in an alternative embodiment, the inverting input may be coupled with the globally offset data signal and the noninverting input may be coupled with the local offset analog signal from DAC2. The comparator 213 compares the signal on its noninverting input with the signal on its inverting input and determines which signal is larger. If the signal on the noninverting input is larger, the comparator 213 outputs a positive voltage. If the signal on the inverting input is larger, the comparator 213 may output a zero or negative voltage. Accordingly, if the globally offset data signal from the circuit 101 on the noninverting input is larger than the local offset signal on the inverting input, the comparator 213 outputs a positive voltage. Otherwise, the comparator 213 outputs a zero or negative voltage. The signal output by the respective comparators 213 may be temporarily stored in the respective sampling latch 214, where the output voltage may be stored as a binary value.

The DAC2 212 may generate local offset analog signals from local offset calibration digital codes. The local offset differs from the global offset in that the global offset may be an offset that affects all of the sampling circuits 102 equally. On the other hand, the local offsets may exist because there may be more than one sampling circuit 102 and each may have different variations in output due to mismatches in various components and devices of the respective sampling circuits 102. Mismatches may occur as a result of statistical variation of structures that occurs during the manufacture of the electrical components in the sampling circuits 102. Therefore, there may be two or more local offsets. In some cases, there may be a distinct local offset calibration digital code for each instance of DAC2 212.

The local offset digital codes may be determined using the local offset calibration logic unit 202 when the serial interface 100 is in calibration mode. The local offset calibration digital codes are the binary representations of the local offset analog signal. The respective local offset digital codes may be stored in the local offset register 207 and provided to the DAC2 212 in an instance of the sampling circuit 102.

Each sampling circuit 102 includes a sampling latch 214 to store the output of the comparator 213. The output is stored as a binary value. The stored digital value in a sampling latch 214 may be output to and stored in digital output register 208 as signal DDS. DDS stored in the digital output register 208 may be provided to the output circuit 106 in normal mode. Otherwise, the DDS may be used during calibration mode and test mode for respectively calibrating and testing particular components of the serial interface 100.

In calibration mode, the serial interface 100 may determine local offset digital codes and global offset calibration digital codes. The determination of local offset calibration digital codes may be performed at initialization of the system or during system operation. To determine local offset calibration digital codes, the first switch 215 is opened and the second switch 216 is moved to a second position, thereby coupling the sampling circuit 102 with a common mode voltage (Vcm). The common mode voltage may be the average voltage around which a differential pair of signals swings. For example, the V+ and V− signals may each oscillate around a common voltage of +1V. Therefore, the noninverting input of each comparator 213 is at Vcm in calibration mode, which is at a balanced or middle value of a differential ADS.

A local offset calibration digital code is determined for the sampling circuit 102 in calibration mode. When determining the local offset calibration digital code for a sampling circuit 102, the local offset calibration unit 202 may initialize the local offset calibration digital code to its initial or default value, such as zero. The initial value may be a middle value in the range of possible digital codes for the DAC2 212. For example, the middle value or middle digital code for a DAC2 212 having output voltages ranging from −8V to +8V is the digital code that would cause the DAC to output 0V if it were operating perfectly. The local offset calibration logic unit 202 may generate and store local offset digital codes in the local offset register 207 for transfer to the DAC2s 212 as initial local offset digital codes. The initial local offset analog signal from DAC2 212 is provided to the inverting input of the comparator 213.

During calibration, a local offset digital code for each DAC2 212 may be determined by the local offset calibration logic 202 using a calibration process. The calibration process for determining local offsets is described as follows. The Vcm signal is placed on the noninverting input and the initial local offset analog signal is placed on the inverting input of the comparator 213. After the inputs are allowed sufficient time to stabilize, and the sampling latch 214 is clocked, the sampling circuit 102 may output either a logical '1' or a logical '0'. If a 1 is output, it indicates that Vcm is greater than the initial local offset analog signal. Conversely, if 0 is output, it indicates that the initial local offset analog signal is greater than Vcm. The sampling latch 214 may be clocked several times without modifying the inputs to the comparator 213. If the output of the sampling latch is the same after each clock, it may be inferred that the output is accurate. Alternatively, if the output of the sampling latch is the same after a first threshold percentage of clock cycles, it may be inferred that the output is accurate. For example, the sampling latch 214 may be clocked ten times without modifying the inputs to the comparator 213. If ninety percent of the outputs are 1, it may be inferred that 1 is an accurate output. On the other hand, the sampling circuit 102 may return both logical 0s and logical 1s over several clock cycles. If the percentages of 1s and 0s are roughly equal, it may be inferred that Vcm and the initial local offset analog signal voltage are equal. This may be referred to as an indeterminate output. The reason that 1's are output on some clocks and 0's on others may be that the two input voltages are substantially equal. The differing outputs in different clock cycles may be due to noise. In one alternative embodiment, if the percentages of 1s or the percentage of 0s is above a second threshold, it may be inferred that Vcm and the initial local offset analog signal voltage are equal. For example, if forty percent of the outputs are 1, it may be inferred that Vcm and the initial local offset analog signal voltages are equal. For calibration purposes, the local offset calibration logic unit 202 searches for the indeterminate state. The digital code that results in the indeterminate state may be selected as the local offset calibration digital code.

During the calibration process, depending on DDS from the sampling circuit 102, the local offset calibration logic unit 202 may determine a direction to move the local offset digital code. In the first case, if DDS of the sampling circuit 102 is a predominance of 1s, then the local offset calibration logic unit 202 may increase the local offset analog signal. In the second case, if the digital output 217 of the sampling circuit 102 is a predominance of 0s, then the local offset calibration logic unit 202 may decrease the local offset analog signal. The calibration process may be iterative. After an increase or decrease in the local offset analog signal, the sampling latch 214 may be clocked two or more times without modifying the inputs to the comparator 213. The DAC2 212 is again allowed to stabilize, DDS is again collected over the plural clock cycles, and the local offset analog signal may be adjusted up or down based on an inference about a difference between the respective signals. These operations may be repeated until it may be inferred that Vcm and the local offset signal voltage are equal.

The calibration process iterates to converge on the indeterminate state, which generally may mean that the sampling circuit 102 generates about 50% 1s and 50% 0s in an embodiment. The local offset digital code that corresponds with the local offset analog signal producing the indeterminate state may be stored in the local offset register 207. The process may be repeated for each sampling circuit 102 in the serial interface 100. Although a calibration process has been described for adjusting the level of a local offset analog signal until the output of the comparator 213 reaches an indeterminate state, other processes such as a digital servo loop may be used for converging on the indeterminate state.

The serial interface 100 having offset local offset DAC2s 212 may be an effective way to recover data over high speed data links. However, if device mismatches and threshold offsets in the data path are large, the DACs should have a large tuning range. Also, for precise data recovery, the DACs should have fine resolution. High resolution in DACs may result in more errors in the DACs. For example, a change of 1 LSB (least significant bit) in the digital code input to a DAC should produce exactly 1 LSB change in the analog output. One type of error in a DAC is that a 1 LSB change in the input digital code does not produce exactly a 1 LSB change in the analog output. In standard testing of the DACs in serial interfaces, to ensure DACs are functioning properly, an expected analog output for a particular input digital code is only possible on the highest order bits, and even that depends on the margins in the design. This makes testing DACs that receive the local offset calibration digital codes and convert the local offset calibration digital codes to the local offset analog signals difficult. Physical defects in the DACS may not be detected during normal functional pattern testing thus exposing the serial interface 100 to possible errors in a customer environment, which is much more expensive to repair. Additional DACs may be implemented into the serial interface 100 to test these DACs. However, adding additional analog circuitry increases cost and size of the serial interfaces 100. Therefore, validating the DACs early in the manufacturing process may be desirable to detect failures before more cost is incurred in higher level assembly.

In one embodiment, referring to FIG. 2, the serial interface 100 may include a test mode for testing the functionality of DAC2 212. In the test mode, the first switch 215 may be open, decoupling the input signal, and the second switch 216 may be moved to a first position, connecting the line receiver amplifier circuit 101 to the sampling circuit 102. In one embodiment, the DAC1 209 may have a higher bit resolution than DAC2 212. For example, the DAC1 209 may have a 12-bit resolution and the DAC2 212 may have 10-bit resolution. In alternative embodiments, the DAC1 209 may have a resolution that is less than or equal to the DAC2 212. In one embodiment, the DAC1 209 and the DAC2 212 may have the same native resolution, but may be configured so that one DAC has a greater effective resolution than the other DAC. For example, both DAC1 209 and DAC2 212 may be a TC1320 digital to analog converter manufactured and sold by Microchip Technology, Inc. The TC1320 has a native resolution of 8 bits. The DAC1 209 may be a first TC1320 having a resolution of 8 bits. The DAC2 212 may be a second TC1320 that has been wired in a manner so that it has a resolution of 4 bits. While the DAC1 209 and A 212 may be discrete integrated circuits, as in the example, both DAC1 209 and DAC2 212 may be disposed on a single integrated circuit in various embodiments.

Each DAC2 212 accepts a range of digital codes and outputs a unique analog voltage for each code. The range of output voltages depends on the resolution of the DAC. In one embodiment, the local offset calibration logic unit 202 may provide a digital code that is at the middle value of a range of output voltages of a particular DAC. The local offset calibration logic unit 202 may store the digital code in the local offset register 207. The middle value digital code may be sent from the local offset register 207 to DAC2 212. The DAC2 212 may output a middle value analog signal, such as 0V, which is applied to the inverting input of the comparator 213.

The multiplexer 203 may be controlled to select as an input to the global offset register 206 either the global offset calibration logic unit 201 or the local offset calibration logic unit 202. In test mode, a middle value digital code is stored in the local offset register 207 causing the DAC1 209 to provide an analog signal to a noninverting input of the comparator 213, the signal being determined by the local offset calibration logic unit 202. After the local offset calibration logic unit 202 stores a middle value digital code in the local offset register 207, the multiplexer 203 is controlled to select the local offset calibration logic unit 202 as the input to the global offset register 206. The amplifier 210 may have a gain of unity where the voltage applied to the input of amplifier 210 is generally the same voltage as the output of the amplifier In test mode, the local calibration logic unit 202 may run the calibration process for determining local offsets described above with respect to calibration mode. Because the multiplexer 203 is controlled to select the local offset calibration logic unit 202 as the input to the global offset register 206, the digital codes generated during the calibration process are stored in the global offset register 206. As described above, a middle value voltage is applied to the inverting input of the comparator 213. The calibration process determines a voltage to be applied to the noninverting input of the comparator 213. The voltage for the noninverting input is determined such that it is within a quantization error of the voltage on the inverting input of comparator 213. The voltage determined for the noninverting input may be substantially equal to the voltage on the inverting input of comparator 213. Accordingly, in test mode, substantially equal voltages are placed on both inputs of the comparator 213, resulting in the DDS of the sampling circuit 102 to be indeterminate over multiple clock cycles. The voltages on the inverting and noninverting inputs of the comparator 213 may be equal to the middle value digital code of the DAC2 212.

Figure 7:
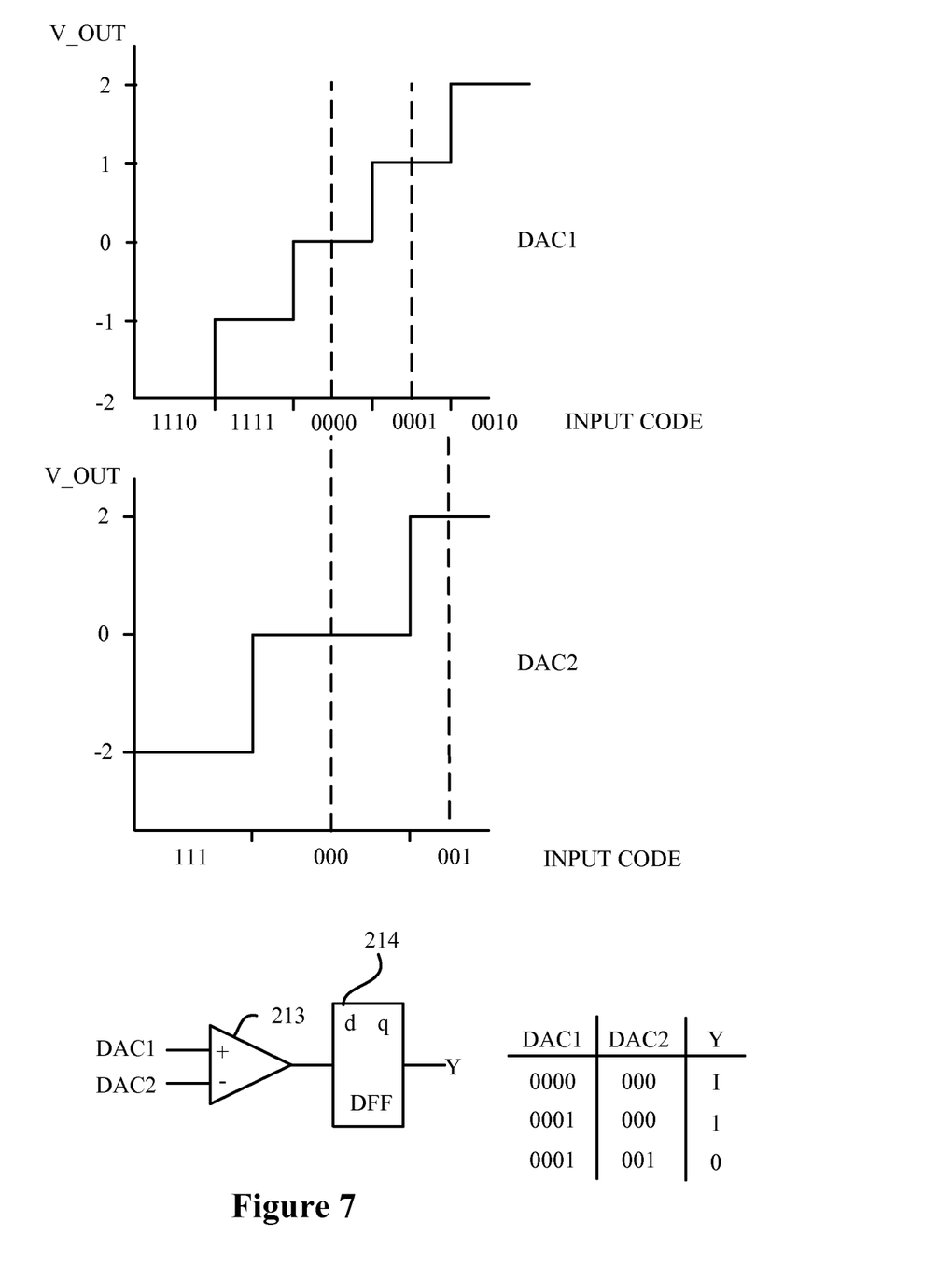
FIG. 7 is a graph of transfer functions for DACs according to an embodiment.

FIG. 7 illustrates additional operations that may be performed in test mode. FIG. 7 shows portions of exemplary transfer functions for the DAC1 209 and DAC2 212. In this example, DAC1 209 has a greater resolution than DAC2 212: DAC1 209 has four-bit resolution and DAC2 212 has three-bit resolution. The DACs are illustrated in association with an exemplary comparator 213. Substantially equal voltages are first placed on the inverting and noninverting inputs of the comparator 213 as described above. In this example, the digital codes that result in substantially equal voltages are 0000 and 000, respectively. When these digital codes are input to the DACs, both output voltages are 0V (the middle value of DAC2 212 in this example) and the comparator output is indeterminate over multiple clock cycles, designated I in the table of FIG. 7. After the indeterminate state is reached, the digital code input to DAC1 209 may be moved up or down one step. The table of FIG. 7 shows the digital code input to DAC1 209 being increased one step from 0000 to 0001. Increasing the digital code input to DAC1 209 to 0001 causes the DAC1 209 to output 1V, which in turn causes the comparator 213 to output a positive voltage that may be interpreted as a logic 1. In a next operation, the digital code input to the DAC2 212 may be moved up or down one step after the output of comparator 213 is in a stable state, e.g., 1V. The table of FIG. 7 shows the digital code input to DAC2 212 being increased one step from 000 to 001. Increasing the digital code input to DAC2 212 to 001 causes the DAC2 212 to output 2V, which in turn causes the comparator 213 to output a zero or negative voltage that may interpreted as a logic 0.

As may be seen from the example of FIG. 7, because the DAC1 209 has a greater resolution than DAC2 212, if the DAC1 209 first outputs an intermediate or "baseline" voltage (1V in the example) that is within a quantization step of the DAC2 212, the output of the comparator 213 may be placed in a stable state (logic 1 in the example). If the output of the comparator 213 is in the stable state and the digital code input to the DAC2 212 is then increased one step, the stable output state of the comparator 213 toggles to a complementary stable state (logic 0 in the example). After the digital code input to the DAC2 212 is increased, the output of the comparator 213 may then be inspected to determine if it toggles (changes from 1 to 0 or 0 to 1). If the output toggles, it may be inferred that the comparator 213 outputs a correct voltage for the particular digital code. On the other hand, if the output does not toggle, it may be inferred that the comparator 213 does not output a correct voltage for the particular digital code.

FIG. 7 illustrates increasing the digital codes input to DAC1 209 and DAC2 212. The process illustrated in FIG. 7 may be repeated for each higher digital code of the DAC2 212. In addition, the digital codes input to DAC1 209 and DAC2 212 may be decreased in a similar process to test for correct output voltages for digital codes lower than the middle value. In this manner, each voltage transition to levels that are higher or lower than the middle voltage of the DAC2 212 may be tested. In summary, by placing the DAC1 209 at the same middle value as DAC2 212, and then incrementing and decrementing the DAC1 209 so that a series of baseline voltages are applied to an input of the comparator 213, the capability of a DAC2 212 to output a distinct and appropriate voltage for each possible input digital code may be tested.

In test mode, the read/write register interface 205 may modify a value stored in the local offset register 207. Accordingly, the read/write register interface 205 may be controlled to store a digital code in the local offset register 207 that is incrementally higher or lower than the initially stored middle value digital code. In other words, the read/write register interface 205 may modify the middle value digital code so that the analog signal output from the DAC2 212 moves up or down from the middle voltage. The stored digital code may be increased until the analog signal output from the DAC2 212 consistently (over plural clock cycles) outputs a positive voltage. In addition, the stored digital code may be decreased until the analog signal output from the comparator 213 consistently (over plural clock cycles) outputs a zero or negative voltage. A positive voltage is stored as a 1 and zero or negative voltage is stored as 0 in sampling latch 214. The change in binary output from the sampling latch 214 signifies that the analog-to-digital conversion function is outputting at a higher or lower LSB level. One type of error in DAC2 is that a 1 LSB change in the input digital code does not produce exactly a 1 LSB change in the analog output. By incrementally changing the digital code applied to the inputs of DAC2 212, it may be determined whether a 1 LSB change in the input to comparator 213 generates a higher or lower LSB level in analog output.

Each digital code of DAC2 212 may be tested. The read/write register interface 205 may determine if the actual DDS of the sampling circuit 102 results in a DDS corresponding with the change in input digital code. If the DDS of the sampling circuit 102 returns expected results, then DAC2 212 is functioning properly. If DDS of the sampling circuit 102 does not produce expected results, then DAC2 212 is not working properly and may need to be replaced or the serial interface 100 may need to be replaced. The test process may be repeated for any or all other sampling circuits such as 102(2)-102(n) (not shown).

In one alternative embodiment for testing of DACs, DAC1 209 may be set at its first baseline voltage within a quantization step as described above. The digital codes of DAC2 212 may then be increased or decreased by the read/write register interface 205 so that the DAC2 212 outputs voltages that are higher or lower than the baseline voltage of DAC1 209. The sampling circuit 102 should output a logic '1' or a logic '0' when the output voltage of DAC2 212 and the baseline voltage of DAC1 209 are compared by the comparator 213. If the digital codes are alternatively increased and decreased, the output of the comparator 213 will toggle, provided the comparator 213 is functioning properly. For example, the digital codes may be input to DAC2 212 to provide the following sequence of output voltages: +1V, -1V, +2V, -2V, +3V, and -3V. DDS of the sampling circuit 102 may be compared to an expected DDS for each digital code of DAC2 212.

According to yet an alternative embodiment, not all digital codes of DAC2 212 need to be tested. Since a DAC may be made of different sized resistive elements, each resistive element of DAC2 212 may only need to be tested. If DAC2 212 is a three-bit DAC, DAC2 212 may have three resistive elements. If each resistive element is tested independently, then it may be determined whether the DAC2 212 is working properly. The DAC1 209 may provide a baseline voltage input to the comparator 213 in such a way that when applying the digital codes to DAC2 212 a predictive DDS is output from the sampling circuit 102. For example, assume the first, second, and third resistive elements of DAC2 2112 output 1V, 2V, and 4V, respectively, when the digital code applied to the inputs activates a single resistive element. If DAC1 209 outputs a baseline voltage of 3V, then it is expected that the sampling circuit 102 outputs DDS as a 1, 1, and 0, respectively, when testing each resistive element. If DDS is as expected for each resistive element, then the DAC2 212 may be working properly.

In another embodiment, where DAC2 212 is being tested, DAC2 212 may have an equal or higher bit resolution than DAC1 209 used for testing DAC2 212. In this situation where DAC2 212 has an equal or greater resolution than DAC1 209, the read/write register interface 205 may set the baseline digital code of DAC1 209 to the digital code that converges with the middle value digital code of DAC2 212 during the calibration process of the test mode. Setting the baseline voltage at the middle value is done instead of stepping up or down the digital code of DAC1 209. The digital code of DAC2 212 may be increased and decreased for all remaining digital codes besides the middle value digital code of DAC2 212. Since the output voltage of the remaining digital codes of the DAC2 212 should not equal the output voltage of the digital code of DAC1 209, an expected logical "1" or logical "0" may be output from the sampling circuit 102 and evaluated by the read/write register interface 105. If DDS of the sampling circuit 102 returns expected results, then DAC2 212 is working properly for those tested digital codes. However, the middle value digital code of DAC2 212 remains untested. Therefore, another step may be necessary to test all resolutions of DAC2 212.

To test the middle value of global offset digital code, the local offset digital code may be stepped up or down one bit. The read/write register interface 205 may set the global offset digital code to the middle value resulting in the expected DDS of the sampling circuit 102 to be a logical '1' or a logical '0'. The read/write register interface 205 may determine if the actual DDS matches the expected result. If the DDS of the sampling circuit 102 returns expected results from all global offset digital code, then DAC1 209 is working properly. If DDS of the sampling circuit 102 does not produce expected results, then DAC1 209 is not working properly and DAC1 209 or serial interface 100 may need replacing. The test may be repeated if there are other global offset DACs.

In one embodiment, DAC1 209 may be tested using DAC2 as the reference DAC by implementing the processes described above where DAC1 209 is the reference DAC and DAC2 212 is being tested. In one embodiment, the functionality of DAC1 209 may be tested independently from DAC2 212. In another embodiment, the functionality of DAC2 212 may be tested independently from DAC1 209. In another embodiment, the functionality of both DAC2 212 and DAC1 209 may be tested.

In various embodiments, the DACs may be controlled by different codes such as binary, two's complement, one's complement, thermometer codes, or grey codes. In various embodiments, filtering or averaging techniques may be used to compensate for quantization errors and noise. In various embodiments, certain lower significant bits in the code might need to be masked or ignored if noise levels cause indeterminate results. For serial interfaces 100 with high numbers of sampling circuits 102 and high DAC resolution, this may be acceptable to provide good product yield.

Figure 3:
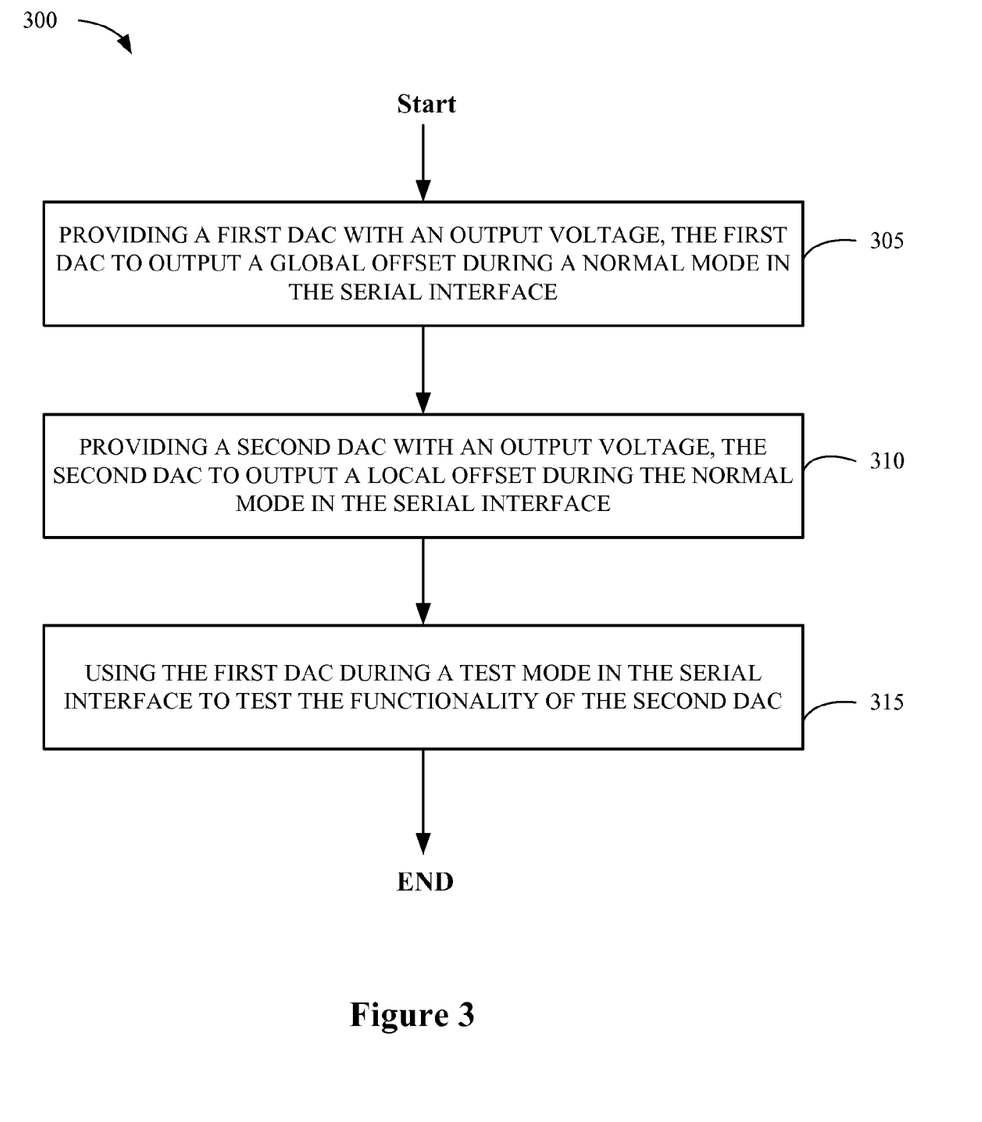
FIG. 3 is a flow diagram of a method for testing DACs of the serial interface.

FIG. 3 is a flow diagram illustrating one embodiment of a high level method 300 for testing DACs of the serial interface 100 of FIG. 2, using the components of the serial interface 100 for testing the DACs. Operation 305 may include providing a first DAC with an output voltage, the first DAC to output a global offset during a normal mode in the serial interface.

Operation 310 may include providing a second DAC with an output voltage the second DAC to output a local offset during the normal mode in the serial interface.

Operation 315 may include using the first DAC during a test mode in the serial interface to test the functionality of the second DAC.

Figure 4:
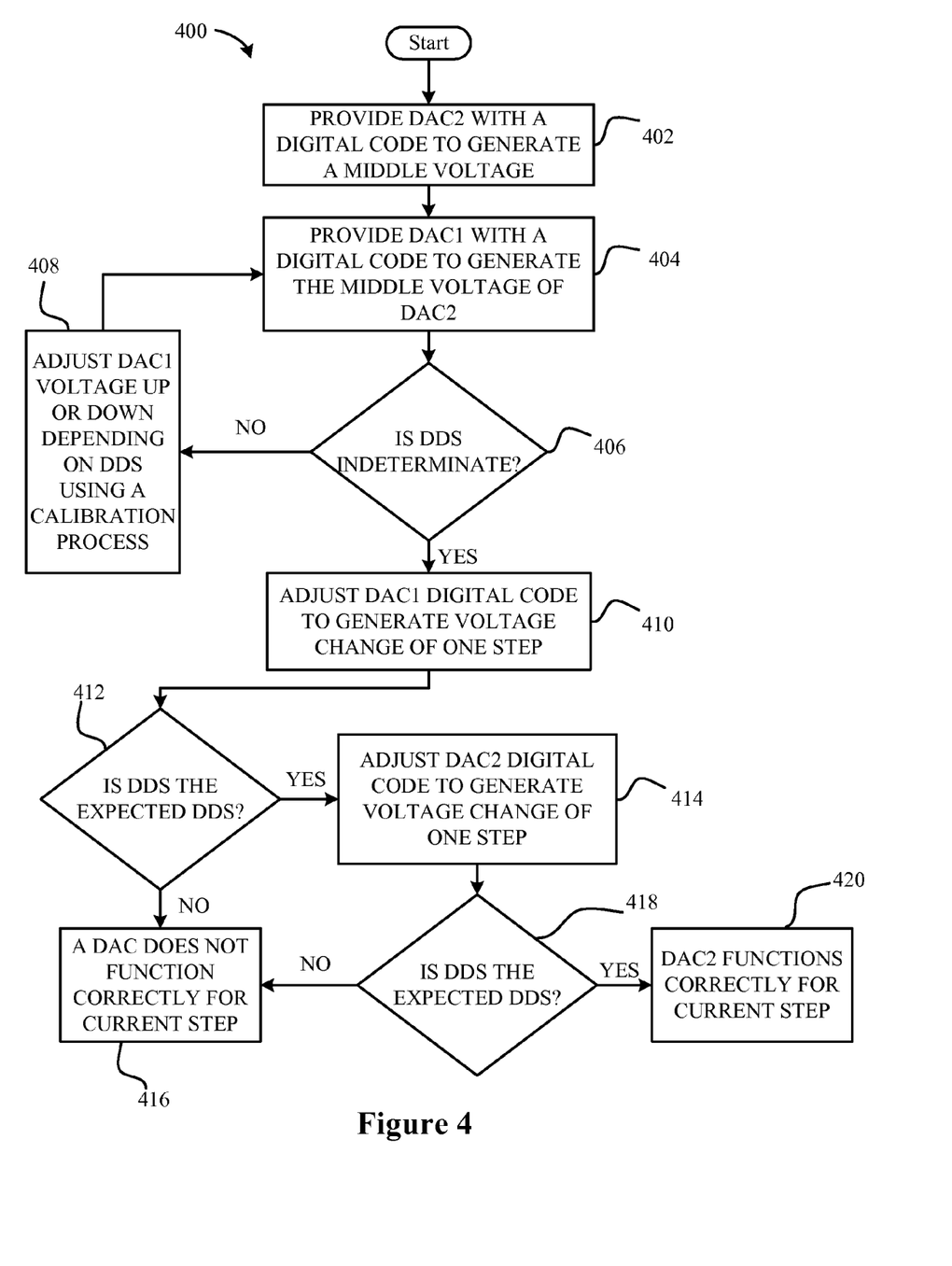
FIG. 4 is a flow diagram showing in greater detail a method for testing DACs in the serial interface.

In one embodiment, FIG. 4 is a flow diagram of a more detailed method 400 for testing DACs of method 300 of FIG. 3. At the start, the serial interface 100 enters test mode. Test mode may be entered when the first switch 215 is opened and the second switch 216 is moved to the first position coupling the receiver amplifier circuit 101 to the sampling circuit 102.

In operation 402, a second digital code may be input to a second DAC. The second DAC may be the DAC being tested. The second digital code may be one that causes the second DAC to output a voltage that is at the middle of its output voltage range, i.e., a second test signal. In one embodiment, the second DAC may provide a local offset reference signal to a comparator during the normal mode of operation or a second test signal to the comparator during the test mode of the method 400.

In operation 404, a first digital code may be input to a first DAC. The first DAC may be the DAC that is used to test the second DAC. The first digital code may be one that causes the first DAC to output a voltage, i.e., a first test signal. The first test signal may be a voltage that is at the middle of the output voltage range of the second DAC. The operation 404 may include controlling a multiplexer so that it selects the output of a local offset calibration logic unit as its input. The output of the multiplexer may be a global offset register coupled with the first DAC. In one embodiment, the operation 404 includes storing the first digital code in the global offset register for input to the first DAC. The local offset calibration logic unit may perform this storing operation. In one embodiment, the first DAC provides a global offset to an input signal during a normal mode of operation or a first test signal to the comparator during the test mode of the method 400.

The operations 406-408 may include determining the first digital code. In one embodiment, the operations 406-408 may include the executing or performing a calibration process in which two or more digital codes are input to the first DAC. The local offset calibration logic unit may execute or perform the calibration process. As described herein, a calibration process may include comparing the voltage output from the first DAC with the voltage output from the second DAC in operation 406. In addition, the calibration process may include increasing or decreasing the voltage output from the first DAC based on the result of the comparison in operation 408. The process of comparing the two output voltages, and increasing or decreasing the voltage output from the first DAC based on the results of the comparison may be repeated until the first digital code is found, the first digital code being one that causes the first DAC to output a voltage that is at the middle of output voltage range of the second DAC. Further, the operation 406 may include detecting a indeterminate DDS of a sampling circuit over multiple clock cycles. The operations for determining the first digital code are further described above.

In operation 410, if DDS is indeterminate, then a third digital code may be input to the first DAC. The third digital code may be one that causes the first DAC to output an intermediate or baseline voltage that is within a quantization step of the second DAC. The operation 410 may require that the first DAC have a higher resolution than the second DAC. Alternatively, the operation 410 may require that the first DAC and second DACs have equal resolutions. The operation 410 may be determined by incrementing or decrementing the value of the first digital code.

The operation 412 may include comparing the voltage outputs of the first and seconds DACS while the third digital code is being input to the first DAC and the second digital code is being input to the second DAC. Typically, the voltage output of the first DAC is either greater or smaller than the voltage output of the second DAC when the third digital code is being input to the first DAC and the second digital code is being input to the second DAC. The result of the comparison may be designated as a logic 1 if the output of the first DAC is greater than the output of the second DAC. On the other hand, the result of the comparison may be designated as a logic 0 if the output of the first DAC is smaller than the output of the second DAC. If the DDS of the sampling circuit, when comparing the voltage outputs of the first and second DACs, does not match the expected DDS, then second DAC does not function correctly for the current step as indicated in operation 416.

In operation 414, a read/write register interface may input a fourth digital code to the second DAC if the expected DDS is output from the sampling circuit. The read/write register interface may determine the fourth digital code by incrementing or decrementing the second digital code. The fourth digital code may be one that causes the second DAC to output a voltage that is one step different from the voltage output in response to the second digital code, provided the second DAC operates properly. The voltage may be one step higher or one step lower.

In operation 418, the voltage output of the second DAC in response to input of the fourth digital code may be evaluated. If the output voltage when the input of the fourth digital code is input to the second DAC is one step different from the output voltage produced in response to the second digital code, it may be inferred that a function of the second DAC is operating properly as in operation 420. On the other hand, if the output voltage when the input the fourth digital code is input to the second DAC is not one step different from the output voltage produced in response to the second digital code, it may be inferred that a function of the second DAC is not operating properly according to operation 416. To make this determination, the operation 418 may include comparing the voltage outputs of the first and second DACs while the third digital code is being input to the first DAC and the fourth digital code is being input to the second DAC. Generally, the voltage output of the first DAC is either greater or smaller than the voltage output of the second DAC when the third digital code is being input to the first DAC and the fourth digital code is being input to the second DAC. The result of the comparison, DDS, may be designated as logic 1 if the output of the first DAC is greater than the output of the second DAC. On the other hand, DDS may be designated as logic 0 if the output of the first DAC is smaller than the output of the second DAC. The operation 418 may include comparing the DDS resulting from the comparison of outputs in operation 418 with the DDS resulting from the comparison of outputs in operation 412. If the logic values differ generated in the two operations differ, i.e., they toggle, such as from 1 to 0, or from 0 to 1, then it may be inferred that a function of the second DAC is operating properly. If the DDS fails to toggle, then it may be inferred that a function of the second DAC is not operating properly. If the second DAC is not operating properly, it may need to be replaced or the serial interface 100 may need to be replaced.

The method 400 has been described with respect to a single second DAC, such as the one provided in each instance of the sampling circuit 102. Moreover, the method 400 has been described with respect to a single increments or decrements of the first and second digital codes. In other words, the testing of only a single step in the second DAC has been described in the method 400. It will be appreciated that a DAC may have many steps (according to its resolution) and that the each step may be evaluated by repeating operations 410 through 418. Furthermore, the method 400 may be repeated for each DAC in a sampling circuit. In addition, while the method 400 has been described with respect to testing the second DAC, the method 400 may be employed to the first DAC.

Figure 5:
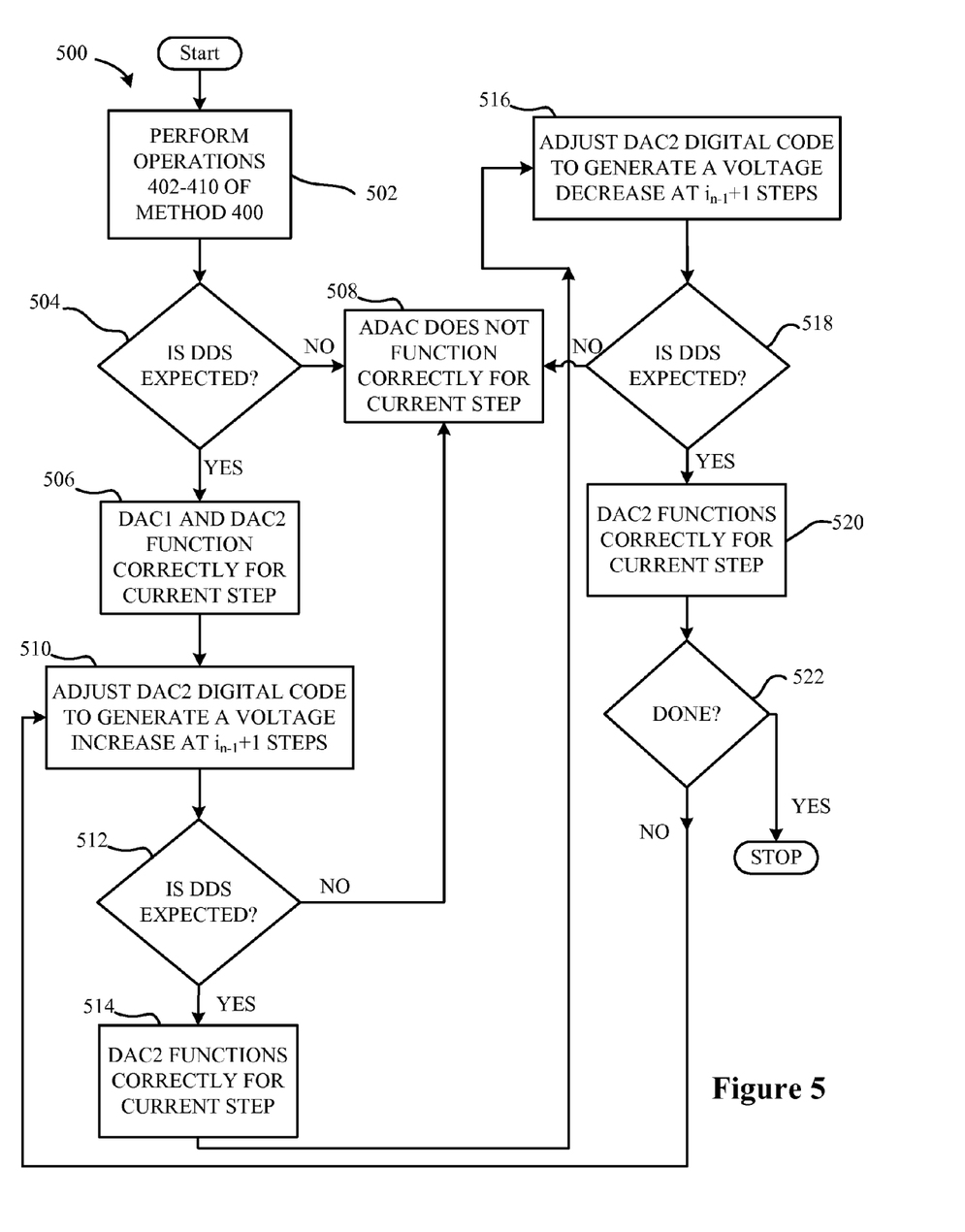
FIG. 5 is a flow diagram showing in greater detail of a calibration process in the method of FIG. 4.

FIG. 5 is a flow diagram of method 500 of an alternative embodiment for testing DACs. In operation 502, operations 402-410 of method 400 above are repeated. After the digital code of the first DAC is adjusted to generate a voltage change of one step to a baseline voltage from the middle voltage of the first DAC, operation 504 may determine whether the DDS of the sampling circuit is as expected (1 or 0) when comparing the baseline voltage of the first DAC and the middle voltage of the second DAC. If DDS is not the expected DDS, then the second DAC does not function correctly in operation 508 for the middle value. If DDS is as expected, then the second DAC does function correctly as in operation 506.

In operation 510, the digital code of the second DAC is adjusted to generate a voltage step of $i_n = i_{n-1} + 1$ steps. The variable $i_n$ represents the present voltage step, n. For example, the digital code of the second DAC may be adjusted from outputting an analog signal from 0V to 1V where for step 1 ($i_0 = 0$), and for step 2 ($i_1 = 1$). The first DAC may be at baseline value of the first DAC which may be, for example, 0.5V. Therefore, if the second DAC is on the noninverting input of the comparator and the first DAC is on the inverting input of the comparator, then DDS of the sampling latch may be expecting logic 0 in operation 512. If the actual DDS is as expected, such as logic 0, in this example, then in operation 514 the second DAC functions correctly for the current step. If the actual DDS is not as expected, then the second DAC does not function correctly for the current step in operation 508.

In operation 516, the digital code of the second DAC may again be adjusted to generate a voltage decrease of $i_n = i_{n-1} + 1$ steps i.e., 1V to −1V since the last step of $i_n$ was $i_1 = 1V$, $i_n$ is now $i_2 = i_1 + 1 = 2$. So the digital code of the second DAC is decreased two steps. The baseline voltage generated from the first DAC remains the same. In operation 518, the voltages from the first and second DACs are compared by the comparator and DDS is again evaluated as to whether it is an expected logic 1 or logic 0. In the example where the first DAC outputs 0.5V and the second DAC outputs −1V, logic 1 may be expected. If DDS is expected, then in operation 520 the second DAC functions correctly. If DDS is as not expected, then in operation 508 the second DAC does not function correctly for the current step.

In operation 522, the read/write register interface determines whether the testing of the second DAC is completed. If the testing is completed, then the test stops. If the testing is not completed method 500 cycles back to operation 510.

The methods of 400, 500 may be implemented in hardware, but in an alternative embodiment, the methods of 400, 500 may be performed by software executing on a processor, or in firmware. In various alternatives, the methods of 400, 500 may be performed using a combination of hardware, software, or firmware components.

Figure 6:
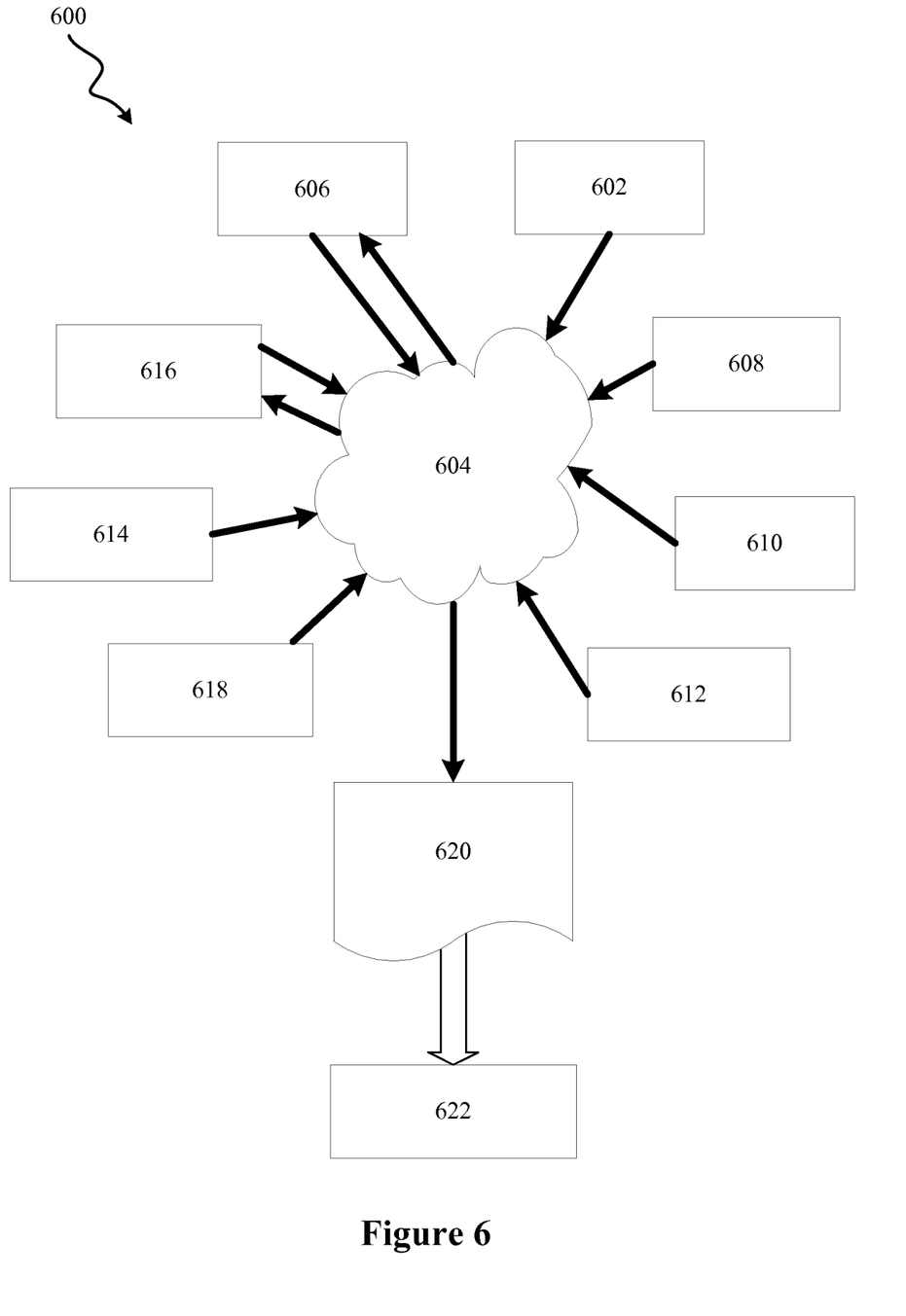
FIG. 6 is a flow diagram of a design process used in semiconductor design, manufacturing, and test.

FIG. 6 shows a block diagram of an example design flow 600 that may be used for serial interfaces 100 described herein. Design flow 600 may vary depending on the type of integrated circuit (IC) being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises single cycle read and copy operation, or all or a portion of SRAM 100, in the form of schematics or HDL, a hardware-description language, for example, Verilog, VHDL, C, and the like. Design structure 602 is tangibly contained on, for example, one or more machine readable storage medium. For example, design structure 602 may be a text file or a graphical representation of serial interface 100. Design process 604 preferably synthesizes, or translates, serial interface 100 into a netlist 606, where netlist 606 is, for example, a list of wires, transistors, logic gates, control circuits, I/O, models, etc. that describes the connections to other elements and circuits in an integrated circuit design and recorded on at least one of machine readable storage medium. This may be an iterative process in which netlist 606 is re-synthesized one or more times depending on design specifications and parameters for the circuit.

Design process 604 may include using a variety of inputs; for example, inputs from library elements 608 which may house a set of commonly used elements, circuits, and devices, including models, layouts, and symbolic representations, for a given manufacturing technology, such as different technology nodes, 32 nm, 45 nm, 90 nm, and the like, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 1-2 along with any additional integrated circuit design or data (if applicable), into a second design structure 620. Design structure 620 resides on a machine readable storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-2. Design structure 620 may then proceed to a stage 622 where, for example, design structure 620 proceeds to tape-out, is released to manufacturing, is released to a mask house, is sent to another design house, is sent back to the customer, and the like.

While the invention has been described with reference to the specific aspects thereof, those skilled in the art will be able to make various modifications to the described embodiments of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

What is claimed is:

1. A serial interface comprising:
a comparator to receive an input signal and a local offset signal;
a first digital to analog converter (DAC) to selectably provide one of a global offset to the input signal during a normal mode of operation and a first test signal to the comparator during a test mode of operation;
a second DAC to selectably provide one of the local offset signals to the comparator during the normal mode of operation and a second test signal to the comparator during the test mode of operation; and
a test module to test the second DAC, the test module to cause the first DAC to determine a first test signal to provide to the global offset input of the comparator, to cause the second DAC to incrementally change a test signal provided to the comparator, and to evaluate the output of the comparator in response to the changes in the test signal to determine whether a function of the second DAC operates properly.

2. The serial interface of claim 1, further comprising: a latch having an analog input coupled with the output of the second DAC, the latch providing digital output.

3. The serial interface of claim 1, wherein the determination of the first test signal includes determining an input signal that is substantially equivalent to the second test signal.

4. The serial interface of claim 1, wherein the resolution of the first DAC is greater than the resolution of the second DAC.

5. The serial interface of claim 1, wherein the resolution of the first DAC is equal to the resolution of the second DAC.

6. The serial interface of claim 1, wherein the resolution of the first DAC is less than the resolution of the second DAC.

7. The serial interface of claim 1, wherein the test module tests the first DAC, the test module to evaluate the output of the comparator in response to the changes in the first and second test signals to determine whether a function of the first DAC operates properly.

8. A method of testing the functionality of a digital to analog converter (DAC) in a serial interface comprising:
providing a first DAC with an output voltage, the first DAC to output a global offset during a normal mode in the serial interface;
providing a second DAC with an output voltage, the second DAC to output a local offset during the normal mode in the serial interface; and
using the first DAC during a test mode in the serial interface to test the functionality of the second DAC.

9. The method of claim 8, wherein the second DAC tests the functionality of the first DAC.

10. The method of claim 8, wherein using the first DAC during a test mode in the serial interface to test the functionality of the second DAC includes:
providing the second DAC with a first digital code to generate a first voltage of the second DAC;
providing the first DAC with a second digital code to generate the first voltage of the second DAC to get an indeterminate digital output from a comparator comparing the first and second DACs;
adjusting the first digital code of the first DAC to a baseline voltage;
evaluating the digital output of the comparator to determine if the first digital code is functioning correctly;
providing a third digital code to generate a second voltage; and
evaluating the digital output of the comparator to determine if the third digital code is functioning correctly.

11. The method of claim 8, wherein the first and second DACs have at least one resistive element.

12. The method of claim 11, wherein using the first DAC during a test mode in the serial interface to test the functionality of the second DAC includes testing the functionality of each resistive element.

* * * * *